US 8,493,116 B2
Jul. 23, 2013

(12) United States Patent
Choi et al.

(10) Patent No.: US 8,493,116 B2
(45) Date of Patent: Jul. 23, 2013

(54) CLOCK DELAY CIRCUIT AND DELAY LOCKED LOOP INCLUDING THE SAME

(75) Inventors: Jong-Ryun Choi, Hwaseong-si (KR); Seong-Ook Jung, Seoul (KR); Suho Kim, Yongin-si (KR); Heechai Kang, Seoul (KR); Kyungho Ryu, Seoul (KR)

(73) Assignees: Samsung Electronics Co., Ltd. (KR); Industry-Academic Cooperation Foundation, Yonsei University, Seoul (KR)

( * ) Notice: Subject to any disclaimer, the term of this patent is extended or adjusted under 35 U.S.C. 154(b) by 131 days.

(21) Appl. No.: 13/232,555

(22) Filed: Sep. 14, 2011

(65) Prior Publication Data
US 2012/0062294 A1  Mar. 15, 2012

Related U.S. Application Data

(60) Provisional application No. 61/383,008, filed on Sep. 15, 2010.

(30) Foreign Application Priority Data

Sep. 15, 2010 (KR) .................. 10-2010-0090336

(51) Int. Cl.
*H03L 7/06* (2006.01)
(52) U.S. Cl.
USPC .......................... 327/158; 327/147
(58) Field of Classification Search
USPC .................................. 327/147, 158
See application file for complete search history.

(56) References Cited

U.S. PATENT DOCUMENTS

| 5,309,035 | A | 5/1994 | Watson et al. |
| 5,317,219 | A | 5/1994 | Lupi et al. |
| 5,374,860 | A | 12/1994 | Llewellyn |
| 5,485,490 | A | 1/1996 | Leung et al. |
| 5,525,939 | A | 6/1996 | Yamauchi et al. |
| 5,561,692 | A | 10/1996 | Maitland et al. |

(Continued)

FOREIGN PATENT DOCUMENTS

| JP | 08-097715 | 4/1996 |
| KR | 10-0174125 | 11/1998 |
| KR | 1020040056909 A | 7/2004 |
| KR | 1020070016035 A | 2/2007 |

OTHER PUBLICATIONS

Radulov et al., "A Binary-To.Thermometer Decoder with built-in redundancy for improved DAC yield," Mixed-Signal Microelectronics Group, Eindhoven University of Technology, The Netherlands; Mixed Signal Design Group, Xilinx, Dublin, Ireland; p. 1414-1417.

(Continued)

*Primary Examiner* — Adam Houston
(74) *Attorney, Agent, or Firm* — Myers Bigel Sibley & Sajovec, P.A.

(57) ABSTRACT

A digital delay line includes a plurality of delay cells therein. The delay line is configured to delay a periodic signal received at a first input thereof by passing the periodic signal through a selected number of the plurality of delay cells, in response to a discontinuous thermometer code that encodes the selected number. A code converter is provided, which includes a group bit decoder, a shared bit decoder and a code output cell array, which are collectively configured to generate the discontinuous thermometer code in response to a binary control code.

20 Claims, 8 Drawing Sheets

U.S. PATENT DOCUMENTS

| | | | |
|---|---|---|---|
| 5,604,775 | A | 2/1997 | Saitoh et al. |
| 5,614,855 | A | 3/1997 | Lee et al. |
| 5,719,515 | A | 2/1998 | Danger |
| 5,777,567 | A | 7/1998 | Murata et al. |
| 5,818,769 | A | 10/1998 | Tweed et al. |
| 5,828,257 | A | 10/1998 | Masleid |
| 5,844,954 | A | 12/1998 | Casasanta et al. |
| 5,847,616 | A | 12/1998 | Ng et al. |
| 5,910,740 | A | 6/1999 | Underwood |
| 5,923,597 | A | 7/1999 | Tweed et al. |
| 6,125,157 | A | 9/2000 | Donnelly et al. |
| 6,134,180 | A | 10/2000 | Kim et al. |
| 6,194,937 | B1 | 2/2001 | Minami |
| 6,822,494 | B2 | 11/2004 | Kim |
| 6,856,558 | B1 | 2/2005 | Proebsting et al. |
| 6,944,070 | B1 | 9/2005 | Proebsting et al. |
| 7,203,126 | B2 | 4/2007 | Proebsting et al. |
| 2007/0030042 | A1 | 2/2007 | Kim et al. |
| 2007/0146024 | A1* | 6/2007 | Allan ............................ 327/156 |
| 2012/0062294 | A1* | 3/2012 | Choi et al. ..................... 327/158 |
| 2012/0262213 | A1* | 10/2012 | Baumann et al. .............. 327/276 |
| 2012/0268184 | A1* | 10/2012 | Baumann et al. .............. 327/277 |
| 2012/0306553 | A1* | 12/2012 | Kim et al. ..................... 327/158 |
| 2013/0049831 | A1* | 2/2013 | Nedachi ........................ 327/158 |

OTHER PUBLICATIONS

Yang et al., "A 40-550 MHz Harmonic-Free All-Digital Delay-Locked Loop Using a Variable SAR Algorithm," IEEE Journal of Solid State Circuits, vol. 42, No. 2, Feb. 2007, p. 361-373.

Dehng et al., "Clock-Deskew Buffer Using a SAR-Controlled Delay-Locked Loop," IEEE Journal of Solid-State Circuits, vol. 35, No. 8, Aug. 2000, p. 1128-1136.

* cited by examiner

CLOCK DELAY CIRCUIT AND DELAY LOCKED LOOP INCLUDING THE SAME

REFERENCE TO PRIORITY APPLICATION

This application claims priority to Korean Patent Application No. 10-2010-0090336, filed Sep. 15, 2010, and U.S. Provisional Application No. 61/383,008, filed Sep. 15, 2010, the entire contents of which are hereby incorporated herein by reference.

BACKGROUND

The present disclosure herein relates to a clock delay circuit, a delay locked loop, and a semiconductor memory device having the same.

A delay locked loop (DLL) is used for generating an internal clock in an electronic device. A typical DLL generates an internal clock synchronized with an external clock by delaying it by a predetermined time through a delay line. This DLL may be used for generating a signal for outputting data from a semiconductor memory device and for storing data therein.

In order to improve a data transfer rate between electronic devices, it is necessary to increase a frequency of an internal clock in the electronic device and also, in order to reduce errors occurring due to high-speed data transfer rate, it needs to accurately position a data valid window.

For example, in a semiconductor memory device, a data transfer rate may be increased by using an internal clock with a multiplied frequency of an external clock. In addition, errors occurring due to high speed data transfer may be reduced by using clocks with an accurate phase delay and accurate duty ratio. However, in the case that an internal clock frequency is increased, harmonic locking may occur during a locking operation of the DLL. Additionally, as a manufacturing process technology becomes more related to miniaturization, process variations may further affect manufacturing processes. Therefore, due to phase delay mismatching of a delay line in the DLL, it becomes more difficult to generate clocks with an accurate phase delay and uniform duty ratio.

SUMMARY

Embodiments of the invention include integrated circuit delay devices. According to some of these embodiments of the invention, an integrated circuit delay device includes a digital delay line having a plurality of delay cells therein. The digital delay line is configured to delay a periodic signal received at a first input thereof by passing the periodic signal through a selected number of the plurality of digital delay cells, in response to a discontinuous thermometer code that encodes the selected number. A code converter is also provided. This code converter may include a group bit decoder, a shared bit decoder and a code output cell array, which are collectively configured to generate the discontinuous thermometer code in response to a binary control code.

According to additional embodiments of the invention, the group bit decoder is configured to generate a plurality of decoded group bits in response to a plurality of most significant bits of the binary control code, and the shared bit decoder is configured to generate a plurality of decoded shared bits in response to a plurality of least significant bits of the binary control code. The code output cell array may also include: (i) a plurality of first decoding groups responsive to corresponding ones of the plurality of decoded group bits; and (ii) a second decoding group responsive to the plurality of decoded shared bits, but, none of the plurality of decoded group bits. In particular, the group bit decoder may be configured to generate $2^m-1$ decoded group bits in response to "m" most significant bits of the binary control code, and the shared bit decoder may be configured to generate $2^n-1$ decoded local bits in response to "n" least significant bits of the binary control code. According to still further embodiments of the invention, the periodic signal is a clock signal and each of the plurality of digital delay cells comprises NAND-type active logic gates having equivalent fan-out loading and at least one inactive dummy NAND-type logic gate.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF EXAMPLE EMBODIMENTS

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Figure 1:
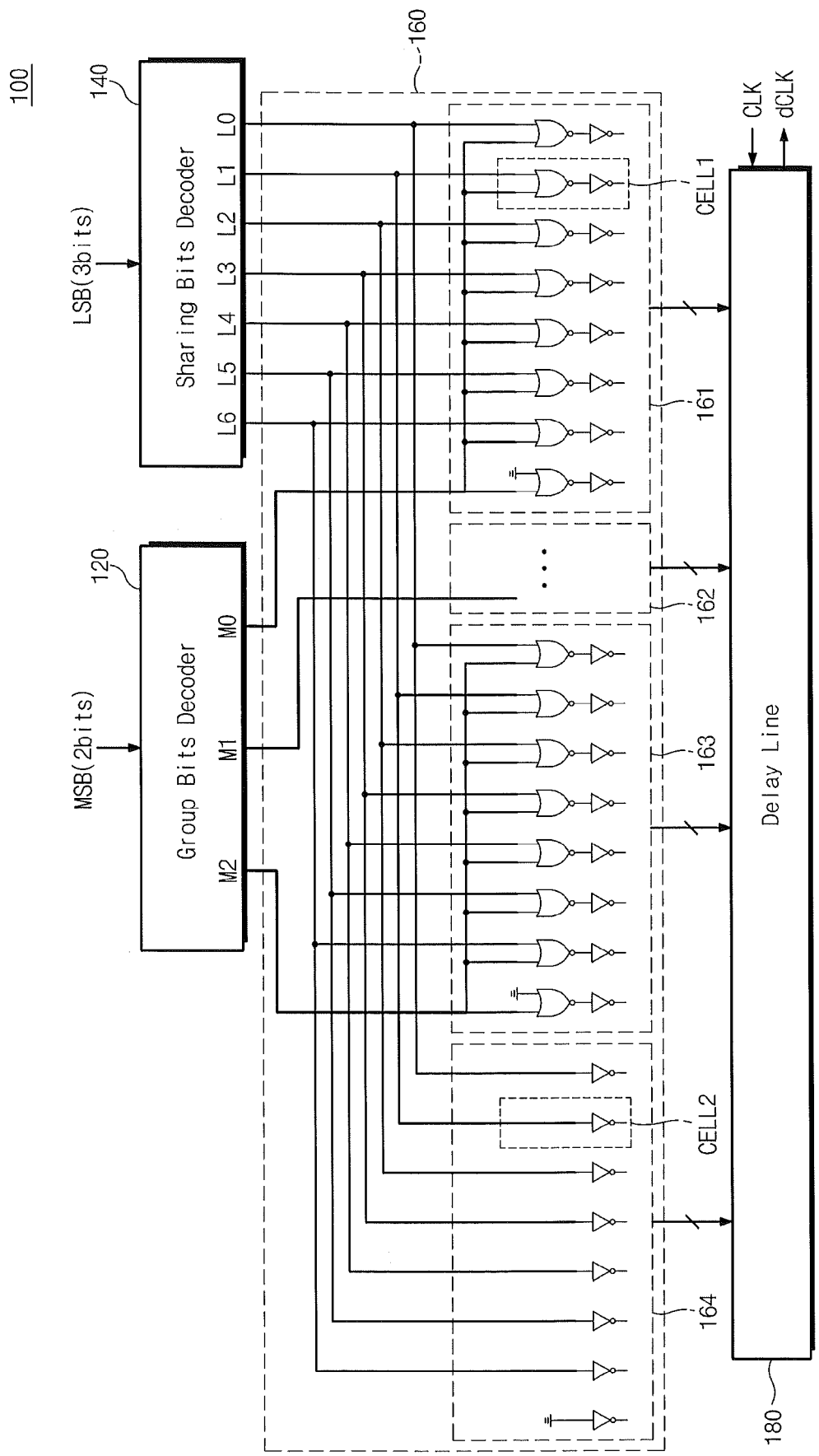
FIG. 1 is a view exemplarily illustrating a clock delay circuit 100 according to an embodiment of the inventive concept.

According to the above-mentioned embodiment of the inventive concept, a clock delay circuit, a delay locked loop, and a semiconductor memory device having the same may reduce area consumption by using a group bit or a sharing bit. FIG. 1 is a view exemplarily illustrating a clock delay circuit 100 according to an embodiment of the inventive concept. Referring to FIG. 1, the clock delay circuit 100 includes a group bit decoder 120, a sharing bit decoder 140, a code output cell array 160, and a delay line 180. The code output cell array 160 includes a first cell CELL1 and a second cell CELL2. Here, the group bit decoder 120, the sharing bit decoder 140, and the code output cell array 160 are collectively called a code converter.

The clock delay circuit 100 outputs a thermometer code after receiving a control code, and delays a clock CLK according to the outputted thermometer code to generate a delay clock dCLK. The control code of FIG. 1 is 5 bits, that is, most significant bits (MSB) are 2 bits and least significant bits (LSB) are 3 bits. However, the numbers of bits of the control code, MSB, and LSB are not limited thereto. In an exemplarily embodiment, the control code is a binary code. In another embodiment, the control code is a hexa code.

The group bit decoder 120 outputs group bits M0 to M2 by receiving the MSB from the control code and decoding them. Here, the MSB are a binary code and the group bits M0 to M2 are a thermometer code. The number of the group bits M0 to M2 depends on the number of MSB. More specifically, the number of group bits M0 to M2 is a value subtracting 1 from 2 to the power of the number of MSB (e.g., $3=2^2-1$, in FIG. 1).

The sharing bit decoder 140 outputs sharing bits L0 to L6 by receiving the LSB from the control code and decoding them. Here, the LSB is a binary code and the sharing bits L0 to L6 are a thermometer code. The number of the sharing bits L0 to L6 depends on the number of LSB. More specifically, the number of sharing bits L0 to L6 is a value subtracting 1 from 2 to the power of the number of LSB (e.g., $7=2^3-1$, in FIG. 1).

The code output cell array 160 includes first groups 161, 162, and 163 having a first cell CELL1 and at least one second group 164 having a second cell CELL2. Here, the first cell CELL1 includes one NOR logic circuit and one inverter configured to perform an "OR" logic function and the second cell CELL2 includes one inverter. Here, the first cell CELL1 outputs a thermometer code using one of a group bit corresponding to a group among the group bits M0, M1, and M2 or one among the sharing bits L0 to L6. Here, the second cell CELL2 outputs a thermometer code using one of the sharing bits L0 to L6.

Each of the first groups 161, 162, and 163 includes a plurality of first cells CELL1. The number of first cells CELL1 in each of the first groups 161, 162, and 163 depends on the number of sharing bits L0 to L6. For example, the number of first cells CELL1 in each of the first groups 161, 162, and 163 is a value adding one to the number of sharing bits L0 to L6. Moreover, the number of first groups 161, 162, and 163 corresponds to the number of group bits M0 to M2.

Some first cells CELL1 of each group receive a group bit corresponding to a group and a corresponding sharing bit among the sharing bits L0 to L6 and output a thermometer code. Here, the number of some first cells CELL1 of each group corresponds to the number of sharing bits L0 to L6. At least one of the first cells CELL1 of each group outputs a thermometer code by receiving a group bit corresponding to a group and a ground terminal. The second group 162 includes a plurality of second cells CELL2. The number of second cells CELL2 in the second group 163 depends on the number of sharing bits L0 to L6. For example, the number of second cells CELL2 in the second group 164 is a value adding one to the number of sharing bits L0 to L6. Some second cells CELL2 of the second group 162 output a thermometer code by receiving and inverting a corresponding sharing bit among the sharing bits L0 to L6. At least one of the second cells CELL2 of the second group 162 outputs a thermometer code inverted by inputting a ground terminal.

The delay line 180 generates a delay clock dCLK delaying a clock CLK inputted according to a plurality of thermometer codes outputted from the code output cell array 160. In an embodiment, the delay line 180 may be an equally weighted delay line. That is, the delay line 180 may be realized with a plurality of delay cells having the same delay time.

In an embodiment, the delay line 180 may be realized to delay a clock CLK until '1' changes into '0' among the thermometer codes outputted from the code output cell array 160. That is, the delay line 180 is realized to output the delay cock dCLK when '1' changes into '0'.

A typical clock delay circuit generates a corresponding thermometer code by receiving a binary control code, and delays a clock according to the generated thermometer code. In relation to the typical clock delay circuit, as the number of binary bits is increased, the number of gates in a code output cell array is increased in $2^n$. Therefore, a typical clock delay circuit occupies a large area.

On the contrary, the clock delay circuit 100 generates a group bit and a sharing bit by receiving a binary control code, generates a thermometer code by using the generated group bit or sharing bit, and delays a clock CLK according to the generated thermometer code. The thermometer code of the inventive concept is discontinuous. This means that the thermometer code is not a continuous thermometer code corresponding to a binary control code but is a code including a thermometer code necessary for generating a delay clock dCLK.

The clock delay circuit 100 realizes a code output cell array 160 occupying a less area through a structural characteristic of the delay line 180. Especially, the clock delay circuit 100 simplifies a structure of the code output cell array 160 by delaying a clock CLK through a discontinuous thermometer code so that the clock delay circuit 100 is advantageous for less area consumption and the degree of integration.

Figure 2:
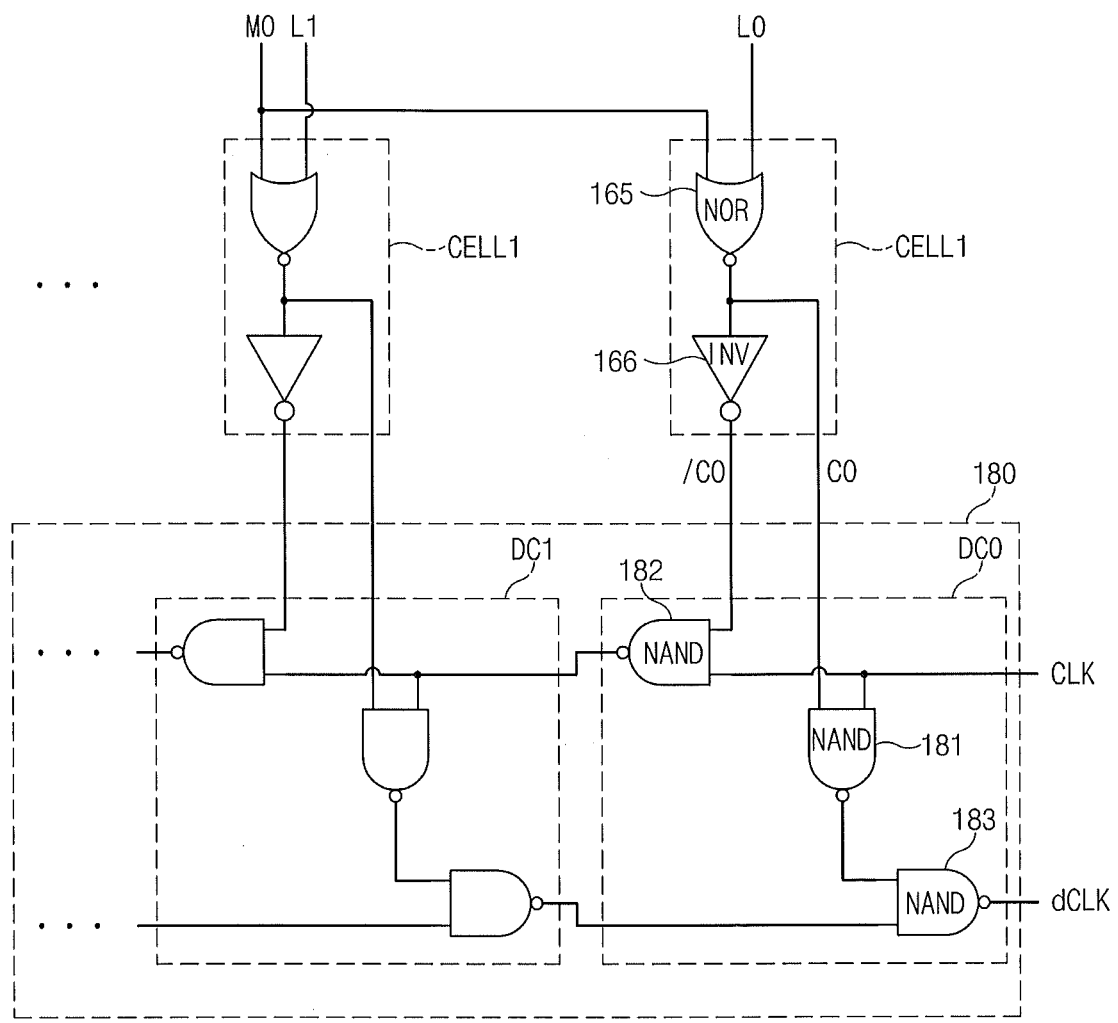
FIG. 2 is a view according to a first embodiment of the delay line 180 of FIG. 1.

FIG. 2 is a view according to a first embodiment of the delay line 180 of FIG. 1. Referring to FIG. 2, the delay line 180 includes a plurality of delay cells DC0 and DC1. Each of the delay cells DC0 and DC1 includes first to third logic circuits 181, 182, and 183. A delay cell DC0 will be mainly described for convenience of description.

A first logic circuit 181 performs a NAND operation by receiving a thermometer code C0 and a clock CLK from a code output cell corresponding to the code output cell array 160. Here, the thermometer code C0 is an output value of a NOR logic circuit 165 performing a NOR operation by receiving a group bit M0 and a sharing bit L0. Here, the group bit M0 is simultaneously inputted to code output cells. A second logic circuit 182 performs a NAND operation by receiving an inverse value /C0 and a clock CLK of a thermometer code C0 from a code output cell corresponding to the code output cell array 160. Here, the thermometer code inverse value /C0 is an output value of the logic circuit 166 inverting an output value of the logic circuit 165. A third logic circuit 183 performs a NAND operation by receiving an output value of the first logic circuit 181 and an output value of a third logic circuit in an adjacent delay cell DC2. Here, an output value of the third logic circuit 183 is a delay clock dCLK. Each of the delay cells DC0 and DC1 shown in FIG. 2 includes three NAND logic circuits. However, the inventive concept is not limited thereto.

Figure 3:
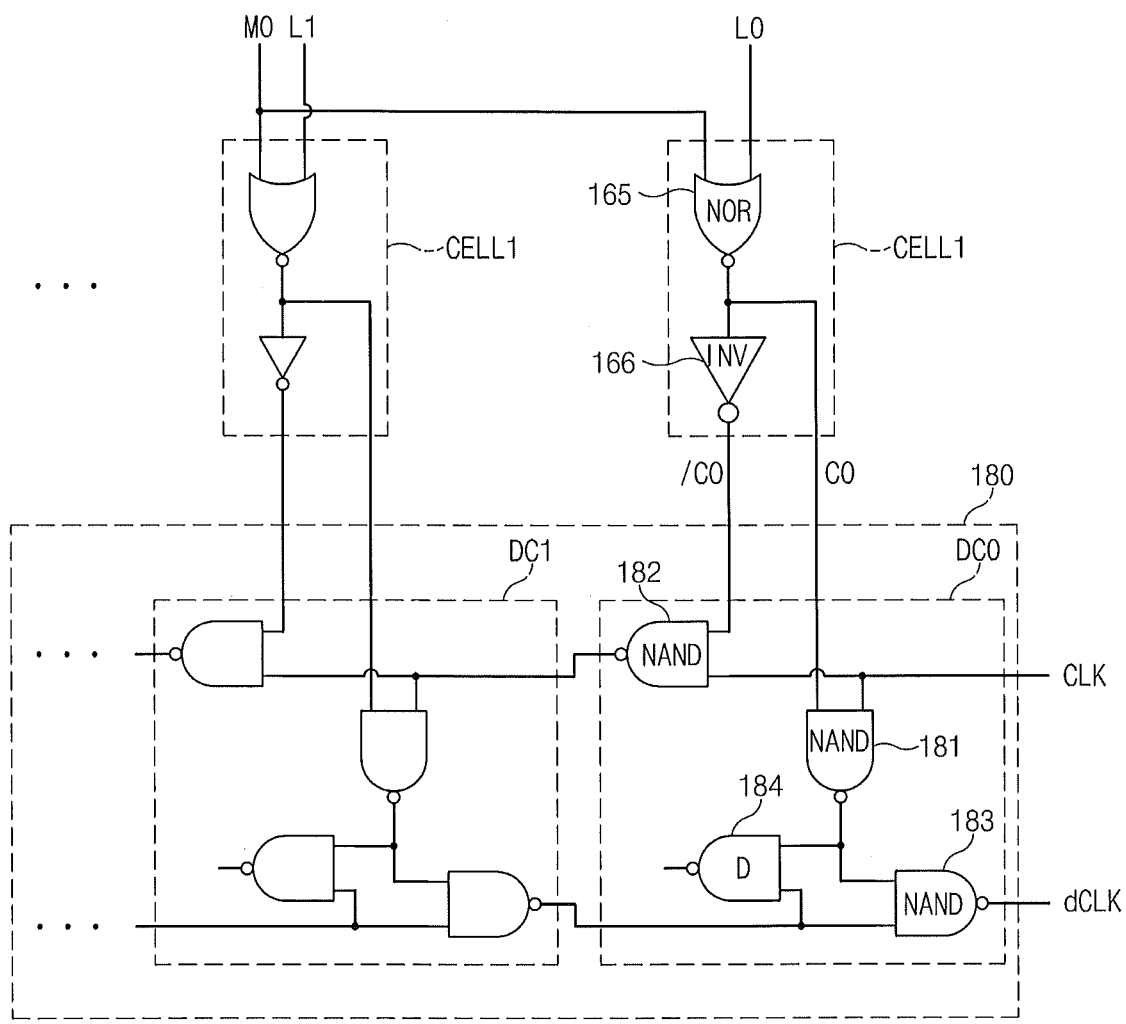
FIG. 3 is a view illustrating a second embodiment of the delay line 180 of FIG. 1.

A delay cell according to an embodiment of the inventive concept may further include a dummy NAND logic circuit to balance capacitance, as shown by FIG. 3. FIG. 3 is a view illustrating a second embodiment of the delay line 180 of FIG. 1. Referring to FIG. 3, the delay line 180 includes a plurality of delay cells DC0 and DC1. The delay cell DC0 will be mainly described below for convenience of description. The delay, cell DC0 may further comprise a dummy logic circuit 184, compared to the delay dell DC0 of FIG. 2. Here, the dummy logic circuit 184 is realized in a position symmetric to the third logic circuit 183 and performs a NAND operation by receiving an output value of the first logic circuit 181 and an output value of the third logic circuit of an adjacent delay cell DC0.

Figure 4:
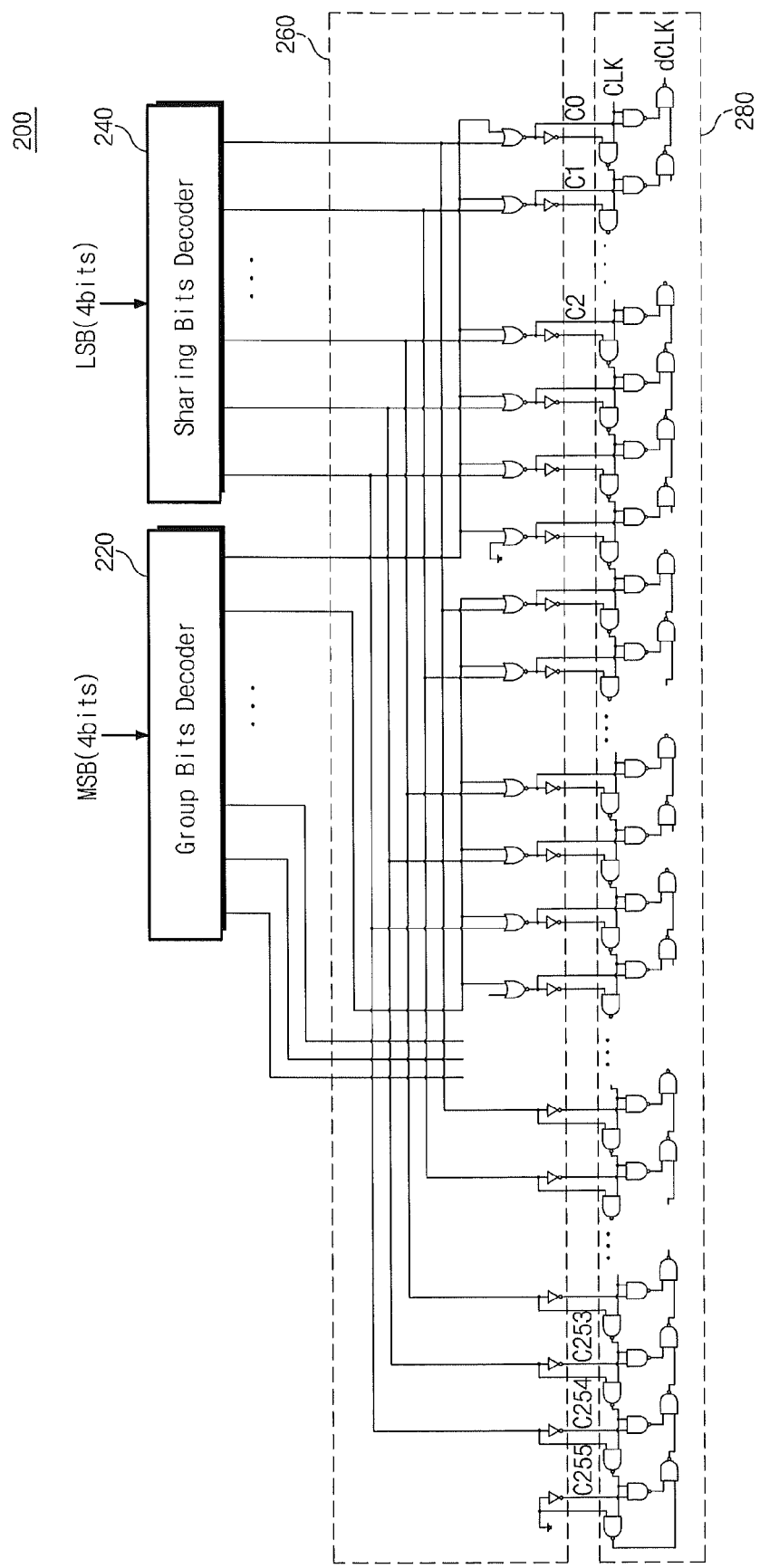
FIG. 4 is a view exemplarily illustrating a clock delay circuit 200 having 256 delay cells.

FIG. 4 is a view exemplarily illustrating a clock delay circuit 200 having 256 delay cells. Referring to FIG. 4, the clock delay circuit 200 includes a group bit decoder 220 generating group bits by receiving and decoding 4-bit MSB, a sharing bit decoder 240 generating sharing bits by receiving and decoding 4-bit LSB, a code output cell array 260 outputting a thermometer code by using a group bit or a sharing bit, and a delay line 280 delaying a clock by receiving a thermometer code.

The code output cell array 260 includes 15 first groups (not shown) and one second group (not shown). Here, each of the first groups is realized with 16 delay cells and each of the delay cells outputs a thermometer code by receiving a shared group bit and a corresponding sharing bit or a ground terminal to perform a NOR operation. The second group is realized with 16 delay cells and each of the delay cells outputs a thermometer code by receiving and inverting a decoded sharing bit of LSB or a ground terminal.

Figure 5A:
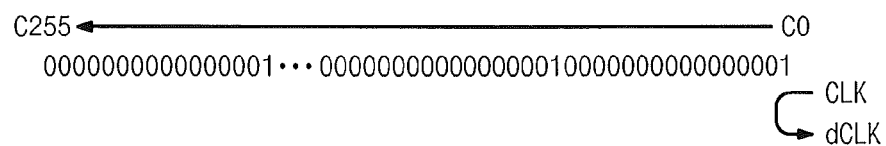
FIG. 5A is a view exemplarily illustrating a thermometer code output when a control code is '00000001'.

FIGS. 5A, 5B, 5C, and 5D are views illustrating an operation of the clock delay circuit 200 of FIG. 4. FIG. 5A is a view exemplarily illustrating a thermometer code output when a control code is '00000001'. Referring to FIG. 5A, since MSB is '0000', the group bit decoder 200 of FIG. 4 outputs '0000000000000000', and each group bit having a value of '0' is inputted into each of the first groups. Moreover, since LSB is '1111', the sharing bit decoder 240 of FIG. 4 outputs '0000000000000001'. Accordingly, thermometer codes C0 to C255 outputted from the code output cell array 260 of FIG. 4 are the same as those of FIG. 5A. Accordingly, the delay line 280 of FIG. 4 generates a delay clock dCLK delaying the inputted clock CLK by 2 delay cells as shown in FIG. 5A. Although a thermometer code is '1' in C17, C32, . . . , C240 besides '1' of C0, because of '0s' therebetween, a clock CLK passes through only two delay cells at the front end.

Figure 5B:
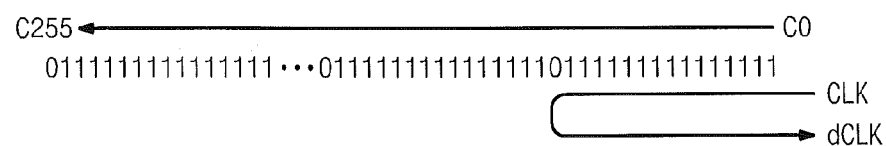
FIG. 5B is a view exemplarily illustrating a thermometer code output when a control code is '00001111'.

FIG. 5B is a view exemplarily illustrating a thermometer code output when a control code is '00001111'. Referring to FIG. 5B, since MSB is '0000', the group bit decoder 200 of FIG. 4 outputs '0000000000000000', and each group bit having a value of '0' is inputted into each of the first groups. Moreover, since LSB is '1111', the sharing bit decoder 240 of FIG. 4 outputs '1111111111111111'. Accordingly, thermometer codes C0 to C255 outputted from the code output cell array 260 of FIG. 4 are the same as those of FIG. 5B. Accordingly, the delay line 280 of FIG. 4 generates a delay clock dCLK delaying the inputted clock CLK by 16 delay cells as shown in FIG. 5B.

Figure 5C:
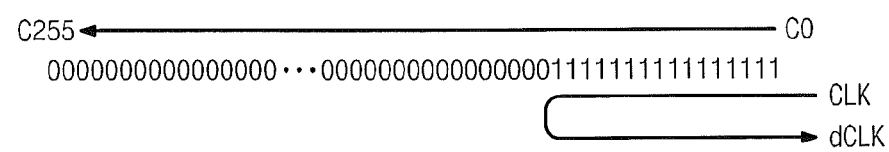
FIG. 5C is a view exemplarily illustrating a thermometer code output when a control code is '00010000'.

FIG. 5C is a view exemplarily illustrating a thermometer code output when a control code is '00010000'. Referring to FIG. 5C, since MSB is '0001', the group bit decoder 200 of FIG. 4 outputs '0000000000000001'. Moreover, since LSB is '0000', the sharing bit decoder 240 of FIG. 4 outputs '0000000000000000'. Accordingly, thermometer codes C0 to C255 outputted from the code output cell array 260 of FIG. 4 are the same as those of FIG. 5C. Accordingly, the delay line 280 of FIG. 4 generates a delay clock dCLK delaying the inputted clock CLK by 17 delay cells as shown in FIG. 5C.

Figure 5D:
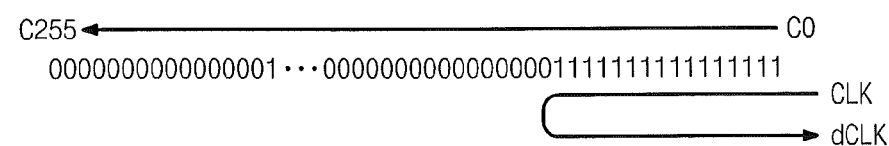
FIG. 5D is a view exemplarily illustrating a thermometer code output when a control code is '00010001'.

FIG. 5D is a view exemplarily illustrating a thermometer code output when a control code is '00010001'. Referring to FIG. 5C, since MSB is '0001', the group bit decoder 200 of FIG. 4 outputs '0000000000000001'. Moreover, since LSB is '0000', the sharing bit decoder 240 of FIG. 4 outputs '0000000000000001'. Accordingly, thermometer codes C0 to C255 outputted from the code output cell array 260 of FIG. 4 are the same as those of FIG. 5D. Accordingly, the delay line 280 of FIG. 4 generates a delay clock dCLK delaying the inputted clock CLK by 18 delay cells as shown in FIG. 5C.

Figure 6:
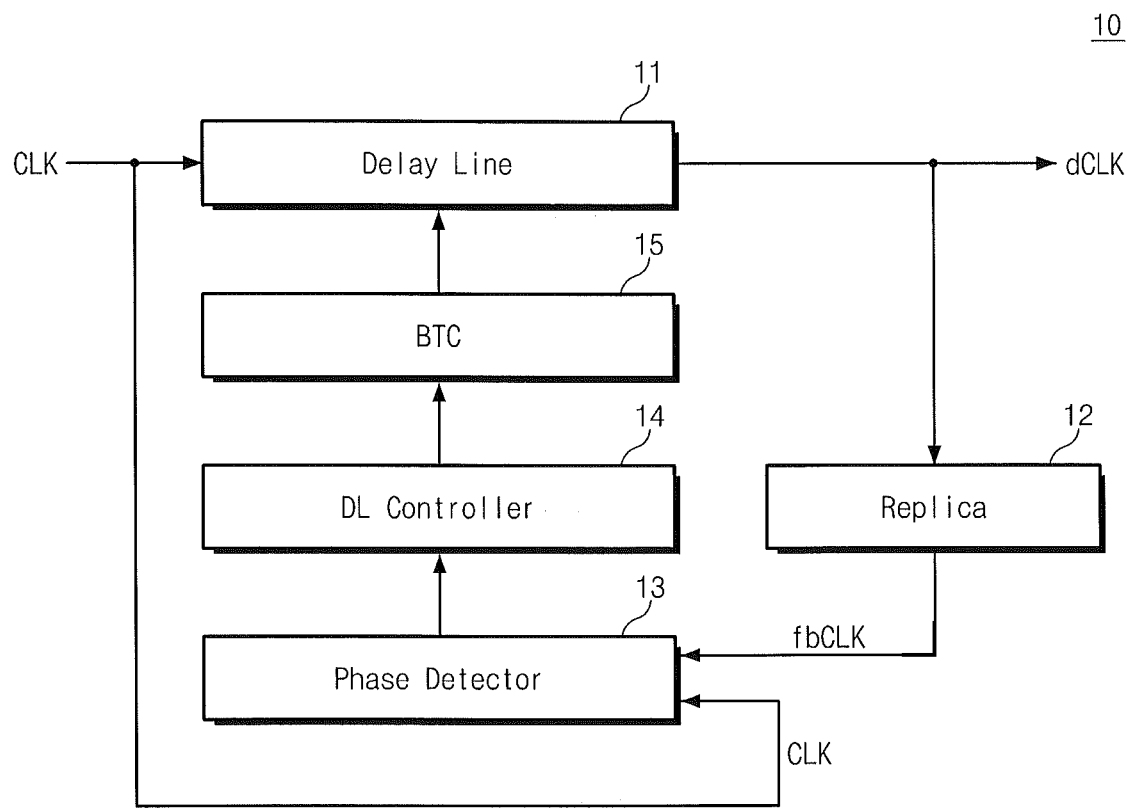
FIG. 6 is a block diagram exemplarily illustrating a delay locked loop 10 according to an embodiment of the inventive concept.

FIG. 6 is a block diagram exemplarily illustrating a delay locked loop 10 according to an embodiment of the inventive concept. Referring to FIG. 6, the delay locked loop 10 includes an equivalent delay line 11, a replica 12, a phase detector 13, a delay controller 14, and a code converter (or BTC) 15. The equivalent delay line 11 includes a plurality of delay cells and outputs a delay clock dCLK delaying an inputted clock CLK by a predetermined time according to a thermometer code. The equivalent delay line 11 may be the delay line 180 of FIG. 1 or the delay line 280 of FIG. 4. The equivalent delay line 11 may be realized with the delay cells DC0 and DC0' shown in FIG. 2 or FIG. 3. The replica 12 is a circuit configured to have the same delay amount as an actual clock path (e.g. tSAC path) through which the delay clock dCLK is delivered to the final data output terminal. The replica 12 generates a feedback delay block fbCLK by receiving a delay clock dCLK. The feedback delay clock fbCLK has the same phase as the clock delivered to the final data output terminal. The phase detector 13 detects a phase difference between the clock CLK and the feedback delay clock fbCLK outputted from the replica 12. The delay line controller 14 determines the increase and decrease of delay amount of the delay line 11 according to a phase detection result inputted from the phase detector 13 and generates a control code corresponding to the determined increase and decrease. Here, the generated control code is a binary code. The code converter 15 receives a control code of the delay line controller 14 and generates a thermometer code to control the equivalent delay line 11. The code converter 15 may be one of the code output cell array 160 of FIG. 1 and the code output cell array 260 of FIG. 4.

The delay locked loop 10 fixes a delay clock dCLK in order to allow a phase of a clock used at the final data input/output terminal of the semiconductor memory device to be synchronized with the clock CLK. That is, a delay time occurring when the delay clock dCLK delayed by the delay locked loop 10 is delivered to the final data input/output terminal is reproduced and fed back through the replica 12. The delay clock dCLK is fixed by controlling a delay amount of the delay line 11 using a phase difference between the clock CLK and the feedback delay clock fbCLK. Accordingly, a phase of the clock used for the final data input/output is synchronized to the clock CLK. The delay locked loop according to an embodiment of the inventive concept may be applied to a synchronous memory device.

Figure 7:
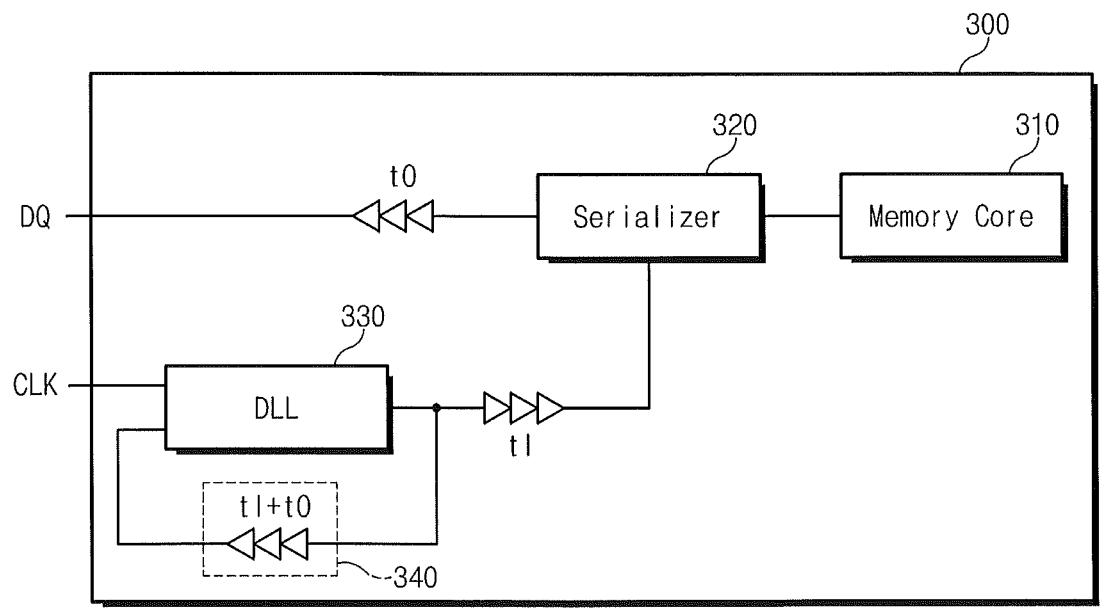
FIG. 7 is a view exemplarily illustrating a semiconductor memory device 300 according to an embodiment of the inventive concept.

FIG. 7 is a view exemplarily illustrating a semiconductor memory device 300 according to an embodiment of the inventive concept. Referring to FIG. 7, the semiconductor memory device 300 includes a memory core 310, a serializer 320, and a delay locked loop 330. In an embodiment, the semiconductor memory device 300 may be Double Data Rate Synchronous Dynamic Random Access Memory (DDR SRAM), DDR, DDR2, DDR3, and DDR5.

In order to obtain an output timing of data DQ in a controller at the external, timing of the clock CLK and output timing of the data DQ are adjusted to each other in pads (not shown) of the semiconductor memory device 300. In order to allow the output edge of the data DQ to be adjusted to the input edge of the clock CLK, the delay locked circuit 330 in the semiconductor memory device 300 compensates for a delay until the data DQ are outputted. The serializer 320 serializes the data outputted from the memory core 310 and outputs the serialized data DQ in response to an output signal of the delay locked loop 330. If a delay time that the clock CLK is transmitted to an input terminal of the serializer 320 through the delay locked circuit 330 is referred to as 't1' and a delay time that the data DQ is transmitted from the serializer 320 to the pad, i.e., to the data pad outputting the data DQ is referred to as 't0' (or 'tSAC') and a replica path 340 is having a delay of (tI+t0) is inputted as a feedback path of the delay locked circuit 330, an output edge of the data DQ and an input edge of the clock CLK become identical to each other.

Figure 8:
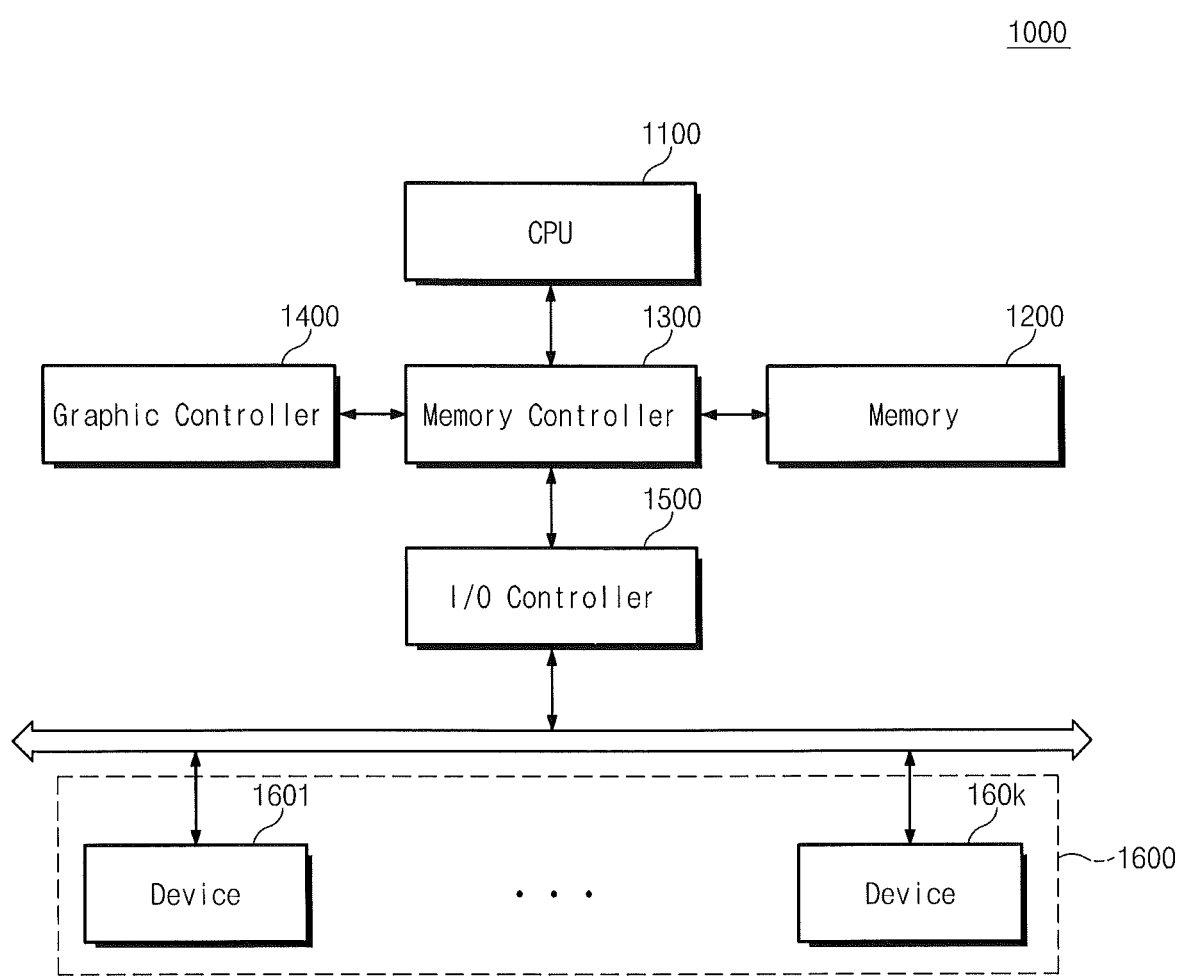
FIG. 8 is a block diagram exemplarily illustrating a computing system 1000 using the semiconductor memory device of FIG. 7.

FIG. 8 is a block diagram exemplarily illustrating a computing system 1000 using the semiconductor memory device of FIG. 7. Referring to FIG. 8, the computer system 1000 includes a central processing unit (CPU) 1100, a memory device 1200, a memory controller 1300, a graphic controller 1400, an input/output controller 1500, and a plurality of devices 1600. The CPU 1100 is a component for controlling general operations of the computer system 1000 and executes a code loaded in the memory device 1200 to perform a command corresponding to the code. The CPU 1100 performs communication with the memory controller 1300, the graphic controller 1400, the input/output controller 150, and the device 1600 and controls them while executing this command. The memory device 1200 stores codes executed by the CPU 1100 and data related to an operation of the CPU 1100. The memory device 1200 as volatile memory may be realized with DDR SDRAM, for example, and includes a DDR2 or DDR3 type. The memory device 1200 may include the semiconductor memory device 300 of FIG. 7. The memory controller 1300 may perform communication with the memory device 1200 in order to perform read and write interfaces with respect to the memory device 1200. The memory controller 1300 may transmit an address, data, and a command to the memory device 1200. The memory controller 1300 may receive a memory output signal outputted from the memory device 1200 and may determine data carried by the memory output signal based on a level thereof. The memory controller 1300 provides read and write interfaces of data between another component such as the CPU and the memory device 1200. The graphic controller 1400 processes graphic data. The input/output controller 1500 provides a communication interface between the CPU 1100 and the devices 1600. The memory controller 1300 and the input/output controller 1500 may be realized with an integrated or additional chip. The memory controller 1300 may be realized integrated with the CPU 1100. The devices 1601 to 160k may include a variety of hardware such as a keyboard, a mouse, tablet, a touch screen, a joystick, a webcam, an image scanner, barcode reader, a soundcard, a speaker, a mike, a printer, CD-ROM, CD-R, CD-RW, DVD-ROM, DVD-R, DVDRW, a USB drive, a modem, and a network card. The computer system 1000 may further include a printed circuit board (PCB) (not shown), called a mother board, and the memory controller 1300 and/or the input/output controller 1500 may be disposed on the PCB. The PCB may include at least one of a plurality of slots (not shown) into which the CPU 110, the memory device 1200, the memory controller 1300, and the device 1600 may be mounted.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An integrated circuit delay device, comprising:
   a digital delay line comprising a plurality of delay cells therein, said digital delay line configured to delay a periodic signal received at a first input thereof by passing the periodic signal through a selected number of the plurality of digital delay cells, in response to a discontinuous thermometer code that encodes the selected number.

2. The delay device of claim 1, further comprising a code converter containing a group bit decoder, a shared bit decoder and a code output cell array; and wherein the group bit decoder, shared bit decoder and code output cell array are collectively configured to generate the discontinuous thermometer code in response to a binary control code.

3. The delay device of claim 2, wherein the group bit decoder is configured to generate a plurality of decoded group bits in response to a plurality of most significant bits of the binary control code; wherein the shared bit decoder is configured to generate a plurality of decoded shared bits in response to a plurality of least significant bits of the binary control code; and wherein the code output cell array comprises a plurality of first decoding groups responsive to corresponding ones of the plurality of decoded group bits.

4. The delay device of claim 3, wherein the code output cell array comprises a second decoding group responsive to the plurality of decoded shared bits, but none of the plurality of decoded group bits.

5. The delay device of claim 4, wherein the group bit decoder is configured to generate $2^m-1$ decoded group bits in response to "m" most significant bits of the binary control code.

6. The delay device of claim 5, wherein the shared bit decoder is configured to generate $2^n-1$ decoded local bits in response to "n" least significant bits of the binary control code.

7. The delay device of claim 6, wherein the periodic signal is a clock signal; and wherein each of the plurality of digital delay cells consists essentially of NAND-type logic gates.

8. The delay device of claim 1, wherein each of the plurality of digital delay cells comprises a plurality of active NAND-type logic gates.

9. The delay device of claim 8, wherein each of the plurality of digital delay cells comprises a dummy NAND-type logic gate.

10. The delay device of claim 9, wherein each of the plurality of active NAND-type logic gates has equivalent fan-out loading.

11. A clock delay circuit comprising:
    a group bit decoder outputting group bits by decoding most significant bits of a control code;
    a sharing bit decoder outputting sharing bits by decoding least significant bits of the control code;
    a code output cell array including first groups and at least one second group, the first groups outputting first thermometer codes by receiving a corresponding group bit among the group bits and the sharing bits, the at least one second group outputting second thermometer codes by receiving the sharing bits; and
    a delay line delaying an inputted clock by using the first and second thermometer codes.

12. The clock delay circuit of claim 11, wherein the control code comprises a binary code.

13. The clock delay circuit of claim 12, wherein the most significant bits are 4 bits and the least significant bits are 4 bits.

14. The clock delay circuit of claim 11, wherein the number of the group bits is a value subtracting one from two to the power of the number of the most significant bits.

15. The clock delay circuit of claim 11, wherein the number of the sharing bits is a value subtracting one from two to the power of the number of the least significant bits.

16. The clock delay circuit of claim 11, wherein each of the first groups comprises a plurality of first cells outputting a thermometer code; and each of the plurality of first cells comprises a NOR logic circuit outputting the thermometer code by using a group bit or a sharing bit and an inverter inverting an output value of the NOR logic circuit.

17. The clock delay circuit of claim 16, wherein some of the plurality of first cells output the thermometer code by receiving the group bit and the sharing bit to perform a NOR operation.

18. The clock delay circuit of claim 17, wherein at least one of the plurality of first cells outputs the thermometer code by receiving the group bit and a ground terminal to perform a NOR operation.

19. The clock delay circuit of claim 11, wherein at least one second group comprises a plurality of second cells outputting a thermometer code, each of the plurality of second cells including an inverter outputting the thermometer code by using a corresponding sharing bit among the sharing bits.

20. A delay locked loop comprising:
a delay line having an equally weighted delay cells and outputting a delay clock by receiving a clock; and
a code converter converting a thermometer code controlling the delay line by receiving a control code,
wherein the code converter comprises:
a group bit decoder outputting group bits by decoding most significant bits of the control code;
a sharing bit decoder outputting sharing bits by decoding least significant bits of the control code; and
a code output cell array including first groups and at least one second group, the first groups outputting first thermometer codes by receiving a corresponding group bit among the group bits and the sharing bits, the at least one second group outputting second thermometer codes by receiving the sharing bits.

* * * * *